(12) United States Patent
Chen

(10) Patent No.: US 6,483,385 B1
(45) Date of Patent: Nov. 19, 2002

(54) SIGNAL AMPLIFICATION CIRCUIT WITH UNEQUAL TOP AND BOTTOM SURFACE AREAS

(75) Inventor: Shen-Whan Chen, Taipei (TW)

(73) Assignee: Gatax Technology Co., Ltd, Taipei (TW)

( * ) Notice: Subject to any disclaimer, the term of this patent is extended or adjusted under 35 U.S.C. 154(b) by 0 days.

(21) Appl. No.: 09/683,080

(22) Filed: Nov. 15, 2001

(51) Int. Cl.[7] ............................................... H03F 3/191
(52) U.S. Cl. ......................... 330/295; 330/302; 330/307
(58) Field of Search ................................. 257/532, 535; 330/67, 295, 302, 307; 333/24 C

(56) References Cited

U.S. PATENT DOCUMENTS 5,111,157 A * 5/1992 Komiak ................. 330/295 X
6,355,970 B1 * 3/2002 Fujii ...................... 257/535 X

* cited by examiner

*Primary Examiner*—Steven J. Mottola
(74) *Attorney, Agent, or Firm*—Winston Hsu

(57) ABSTRACT

The present invention provides a signal amplification circuit used in a portable communications device. The signal amplification circuit has an input circuit for supplying input signals, an output circuit for outputting amplified signals, and a capacitor with a top surface and a plurality of bottom surfaces. The signal amplification circuit further includes a plurality of amplification units electrically connected between the top surface and the output circuit, and a bias voltage circuit electrically connected to the top surface for supplying a direct current bias voltage to the amplification units. When an input signal passes into the bottom surfaces of the capacitor, the input signal is coupled with the top surface of the capacitor and passes to the output circuit through the plurality of amplification units to generate an amplified output signal.

7 Claims, 5 Drawing Sheets

SIGNAL AMPLIFICATION CIRCUIT WITH UNEQUAL TOP AND BOTTOM SURFACE AREAS

BACKGROUND OF THE INVENTION

1. Field of the Invention

The present invention relates to a signal amplification circuit used in a portable communications device, and more particularly, to a signal amplification circuit whose areas of the top and bottom surfaces are not equal.

2. Description of the Prior Art

Portable communications devices, such as cellular phones, are increasingly popular as they are light weight and do not need a fixed wire for operation. Typically, these devices are used to transmit and receive voice signals. However, as a frequency and power of voice signals is relatively low, the signals must be modulated with much higher frequency carriers to transmit over very long distances. In general, after portable communications devices receive high frequency signals, a series of signal processing steps are required, and the signals must also be amplified, so that users can hear the voice data clearly. Because portable communications devices use wireless high frequency signals as media, the received signals often experience interference in the form of noise. Therefore, each level of amplification circuits in the portable communications devices for amplifying signals must be designed carefully. Impedance matching between each level of amplification circuits must be considered in order to avoid noise propagating and affecting signal amplification. When matching impedance, frequency characteristics of signals are considered to meet different frequency echoes of each level amplification circuits.

Capacitors are commonly used when performing impedance matching. Please refer to FIG. 1. FIG. 1 is a diagram of a structure of a prior art capacitor 10. The capacitor 10 is made of two identically shaped surfaces, a top surface 12 and a bottom surface 16, which are positioned on opposite sides of a dielectric layer 14. The top surface 12 and the bottom surface 16 are thin layer conductors, which attach at both sides of the dielectric layer 14 to form the capacitor 10.

Please refer to FIG. 2. FIG. 2 is a diagram of the capacitor 10 used in a prior art signal amplification circuit 20 to match impedance. The signal amplification circuit 20 is made of an input circuit 22, a pre-amplification circuit 24, the capacitor 10 for matching impedance, a bias voltage circuit 28, four amplification units 30, and an output circuit 32. The input circuit 22 is electrically connected to the pre-amplification circuit 24, and an output port of the pre-amplification circuit 24 is electrically connected to the bottom surface 16 of the capacitor 10 (see FIG. 1). The four amplification units 30 and the bias voltage circuit 28 are electrically connected to the top surface 12 of the capacitor (see FIG.1). Finally, the four amplification units 30 are electrically connected to the output circuit 32.

Operation of the signal amplification circuit 20 is as follows. First, signals are inputted to the pre-amplification circuit 24 from the input circuit 22 and undergo a first amplification in the pre-amplification circuit 24. Next, the signals are transmitted to the bottom surface 16 of the capacitor 10 for impedance matching, passing through the dielectric layer 14 coupled with the top surface 12 of the capacitor 10. After passing through, the signals are distributed to the four amplification units 30 from the top surface 12 to undergo a second signal amplification. After the two signal amplification phases, the signal is outputted to the output circuit 32 to complete the signal amplification function of the signal amplification circuit 20. In the signal amplification circuit 20, the top surface 12 of the capacitor 10 is not only electrically connected to each amplification unit 30, but is also electrically connected to the bias voltage circuit 28. This provides a path of electrical connection so that the bias voltage circuit 28 can provide the power of the bias voltage to each of the amplification units 30 through the top surface 12 of the capacitor 10.

When designing the matching impedance in the prior art, it is often hoped that the capacitance value of the capacitor 10 can change with the need of circuit design. If the capacitance value of the capacitor 10 needs to be changed, the shapes and the areas of the top and bottom surfaces 12, 16 of the capacitor 10 are also changed. This is because the capacitance value of the capacitor 10 and the areas of the top and bottom surfaces 12, 16 of the capacitor 10 are linearly directly proportional. Therefore, in the prior art design, reducing the capacitance value of the capacitor 10 because of the need of impedance matching is usually accomplished by reducing the areas of the top and bottom surfaces 12, 16 of the capacitor 10. However, by reducing the areas of the top and bottom surfaces 12, 16 of the capacitor 10, the electrically connecting path provided to each amplification unit 30 by the bias voltage circuit 28 is reduced. Because each amplification unit 30 in the signal amplification circuit 20 is used for power amplification, the need to bias the voltage power is high. The high power passes through the reduced top surface 12, burning the top surface 12 of the capacitor 10, and the capacitor 10 loses efficacy. To avoid this situation, the top and bottom surfaces 12, 16 of the capacitor 10 are limited to a fixed range. With this constraint, the flexibility of changing the capacitance value of the capacitor 10 reduces, and therefore the difficulty of matching the impedance increases.

SUMMARY OF INVENTION

It is therefore a primary objective of the claimed invention to provide a signal amplification circuit whose areas of the top and bottom surfaces are not equal to increase the flexibility of designing impedance matching.

In a preferred embodiment, the claimed invention provides a signal amplification circuit used in a portable communications. The signal amplification circuit includes an input circuit for supplying input signals, an output circuit for outputting amplified signals, and a capacitor. The capacitor includes a top surface and a plurality of bottom surfaces, with a total area of the bottom surfaces being less than a total area of the top surface. The bottom surfaces are electrically connected to the input circuit. The signal amplification circuit further includes a plurality of amplification units electrically connected between the top surface and the output circuit and a bias voltage circuit electrically connected to the top surface for supplying a direct current bias voltage to the amplification units. When an input signal passes into the bottom surfaces of the capacitor through the input circuit, the input signal is coupled with the top surface of the capacitor and is passed on to the output circuit through the plurality of amplification units to generate an amplified output signal.

It is an advantage of the claimed invention that the signal amplification circuit increases the flexibility of designing impedance matching.

These and other objectives and advantages of the present invention will no doubt become obvious to those of ordinary skill in the art after having read the following detailed description of the preferred embodiment that is illustrated in the various figures and drawings.

DETAILED DESCRIPTION

Figure 1:
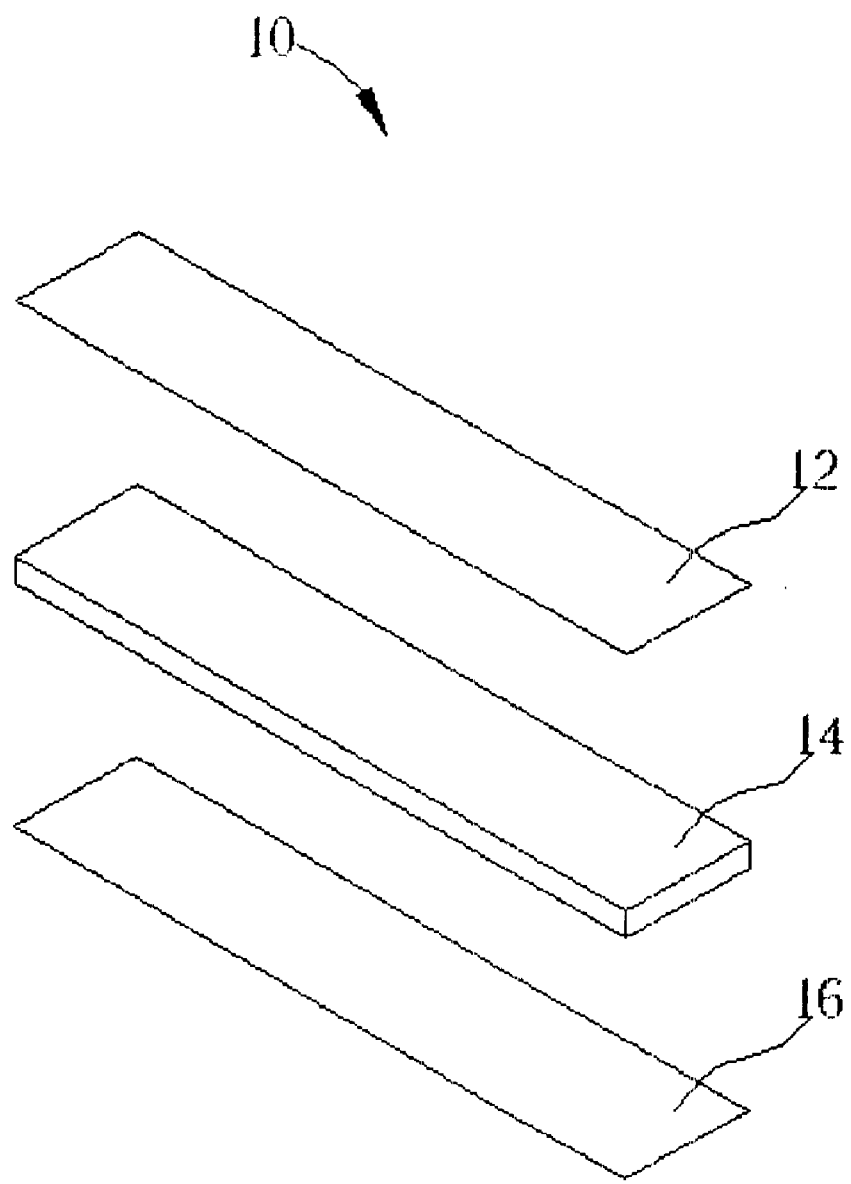
FIG. 1 is a diagram of a structure of a prior art capacitor.
Figure 2:
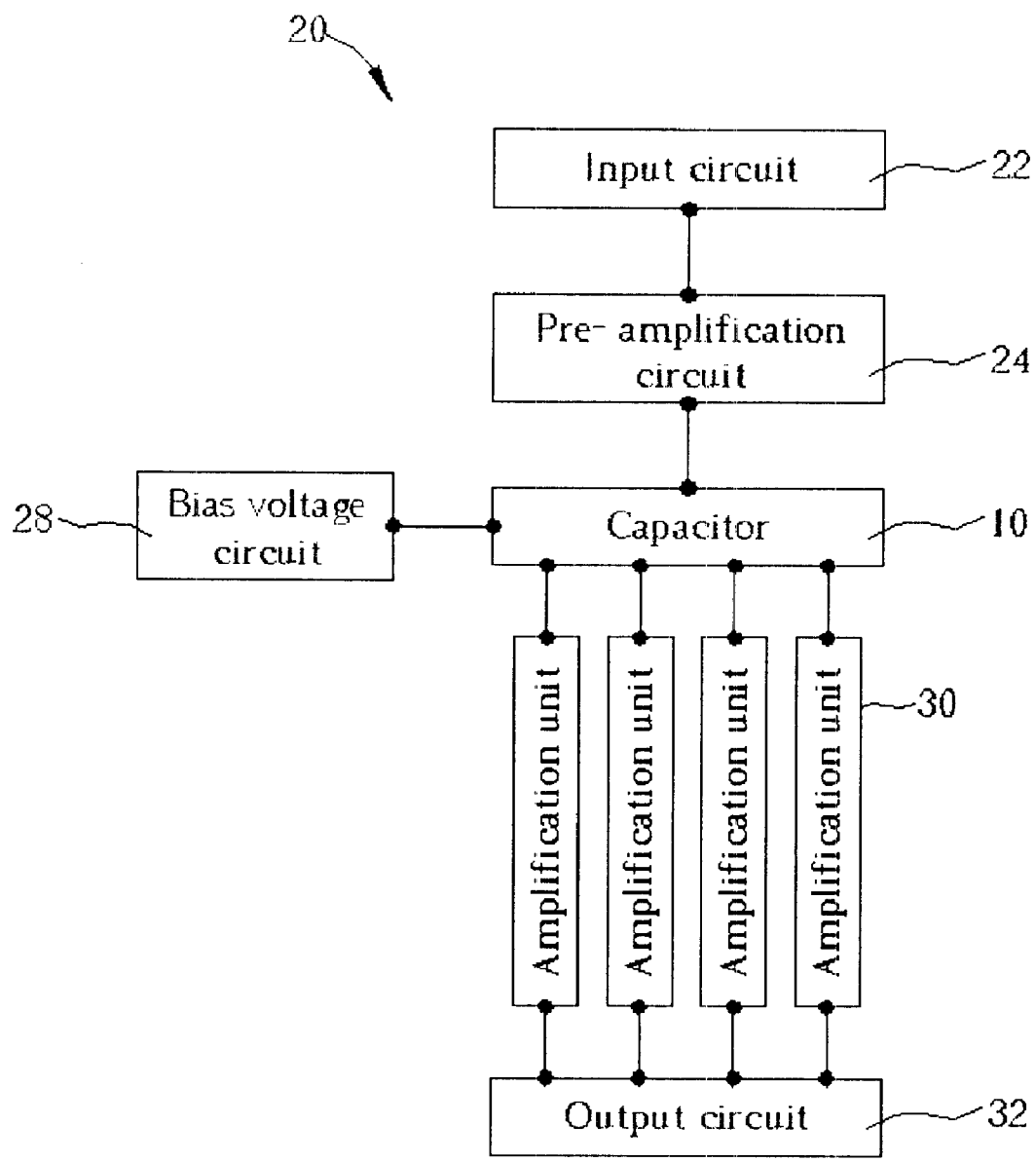
FIG. 2 is a diagram of a structure of a prior art signal amplification circuit.
Figure 3:
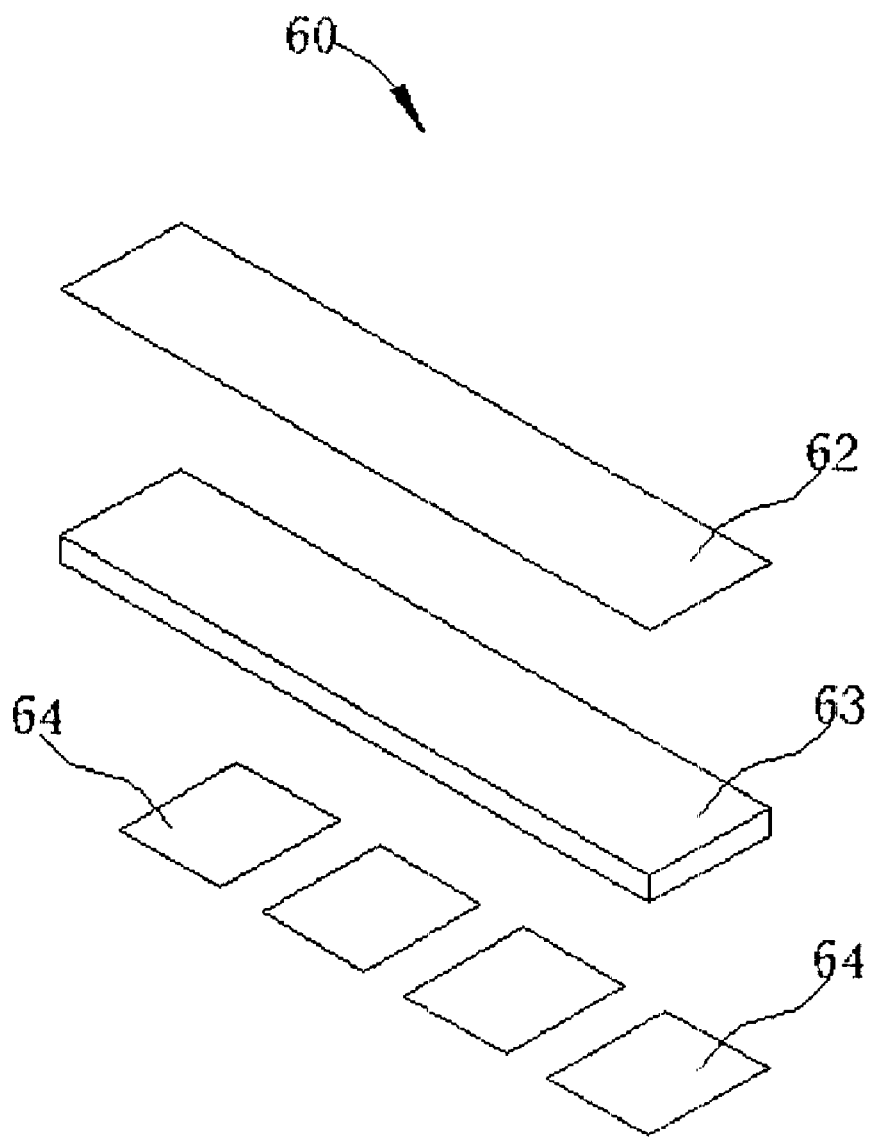
FIG. 3 is a diagram of a structure of a present invention capacitor.
Figure 4:
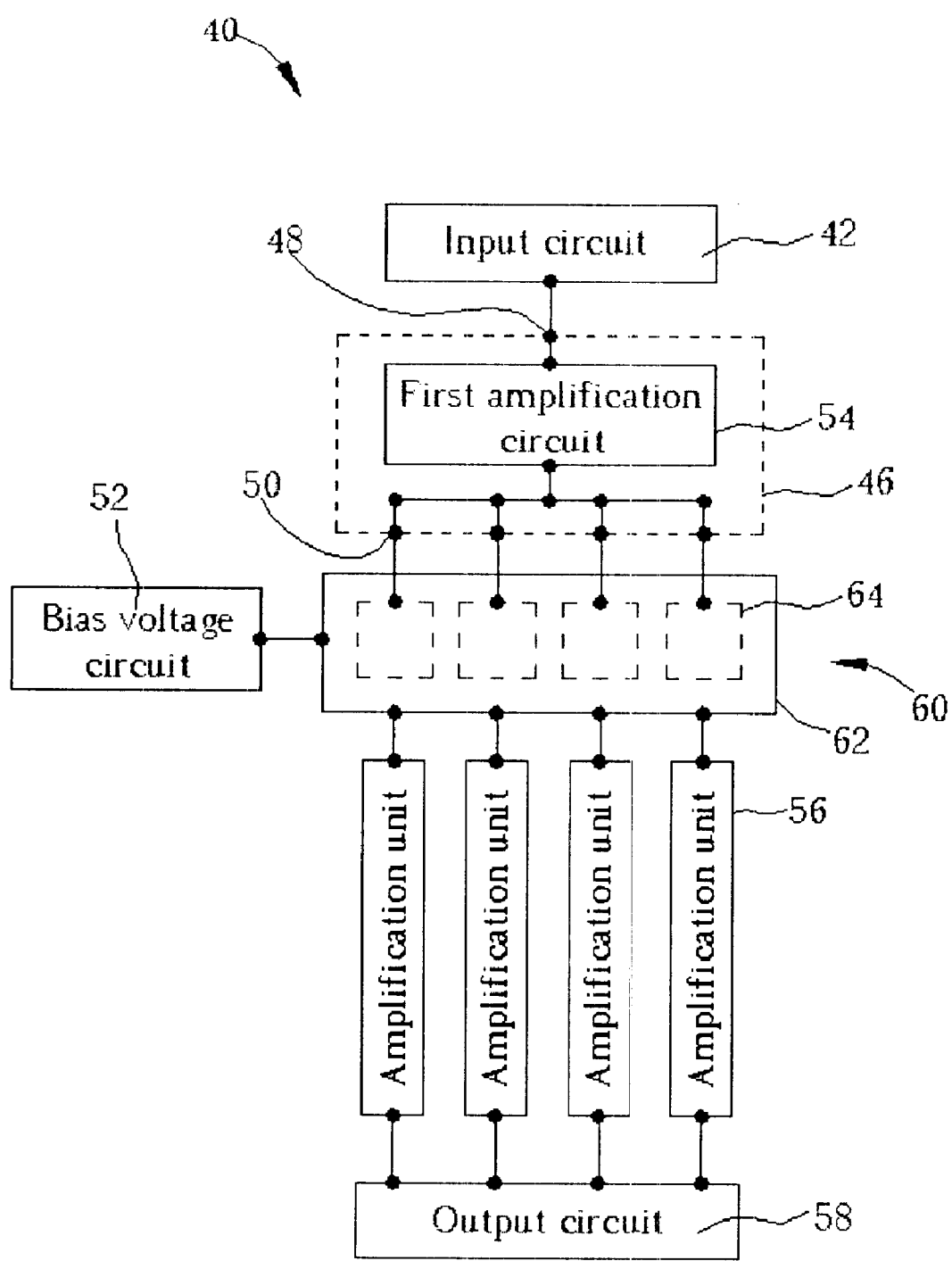
FIG. 4 is a diagram of a structure of a present invention signal amplification circuit.

Please refer to FIG. 3 and FIG. 4. To increase the design range of the capacitance value of a present invention signal amplification circuit 40, the present invention signal amplification circuit 40 uses a capacitor 60 to replace the prior art capacitor 10. FIG. 3 is a diagram of a structure of the capacitor 60 used in the present invention signal amplification circuit 40. The capacitor 60 is made of a top surface 62, a dielectric layer 63, and four bottom surfaces 64. The top and bottom surfaces 62 and 64 are all thin layer conductors. To provide the four amplification units 56 with same characteristics electrical connections to the bottom surfaces 64 of the capacitor 60 in the present invention signal amplification circuit 40, the capacitor 60 has four bottom surfaces 64, each with the same area. A total area of the four bottom surfaces 64 is smaller than an area of the top surface 62.

FIG. 4 is a diagram of a structure of the present invention signal amplification circuit 40. The signal amplification circuit 40 comprises an input circuit 42, a pre-amplification circuit 46, a capacitor 60, a bias voltage circuit 52, four amplification units 56 with same characteristics, and an output circuit 58. The pre-amplification circuit 46 has a first signal input port 48, a first amplification unit 54, and four first signal output port 50 corresponding to the four bottom surfaces 64 of the capacitor 60. An input port of the first amplification unit 54 is electrically connected to the first signal input port 48, and an output port of the first amplification unit 54 is electrically connected to all the four first signal output ports 50. In the present invention signal amplification circuit 40, the input circuit 42 is electrically connected to the first signal input port 48 of the pre-amplification circuit 46, and the four first signal output ports 50 of the pre-amplification circuit 46 are electrically connected to the respective four bottom surfaces 64 of the capacitor 60. The top surface 62 of the capacitor 60 is electrically connected to the four amplification units 56 with same characteristics. Finally, the four amplification units 56 are electrically connected to the output circuit 58. The bias voltage circuit 52 is electrically connected to the top surface 62 of the capacitor 60 and provides bias voltage power to the four amplification units 56 via the top surface 62.

The operations of the present invention signal amplification circuit 40 are described below. Signals first enter the pre-amplification circuit 46 through the first signal input port 48 from the input circuit 42. Signals pass into the first amplification unit 54 from the first signal input port 48 and have a first amplification in the first amplification unit 54. After the first amplification by the first amplification unit 54, signals are evenly distributed to the four first signal output ports 50 of the first amplification unit 54 and delivered to the corresponding bottom surfaces 64 of the capacitor 60 by the four first signal output ports 50. Signals are coupled with the top surface 62 of the capacitor 60 from the four bottom surfaces 64 and transmitted to the four amplification units 56. Signals take a second amplification in the four amplification units 56 and output to the output circuit 58. The bias voltage circuit 52 provides bias voltage power to the four amplification units 56 through the top surface 62 of the capacitor 60 so that not only does the capacitor 60 match an impedance between the pre-amplification circuit 46 and the amplification units 56, but also the top surface 62 provides the bias voltage circuit 52 to the electrically connecting path of the amplification units 56.

In the present invention signal amplification circuit 40, if the capacitance value of the capacitor 60 needs to be adjusted because of impedance matching, each area of the bottom surfaces 64 is capable of changing to adjust the capacitance value of the capacitor 60. As mentioned above for the prior art, if the capacitance value needs to be reduced because of impedance matching, the areas of the top and bottom surfaces 12, 16 of the prior art capacitor 10 must be reduced. Nevertheless, the bias voltage power provided to the amplification units 30 by the bias voltage circuit 28 will burn the capacitor 10 because the top surface 12 of the prior art capacitor 10 is too small. To avoid this situation, the prior art limits the adjustable range of the capacitance value of the prior art capacitor 10. This limitation increases the difficulty of impedance matching. Comparatively speaking, the capacitor 60 in the present invention signal amplification circuit, 40 uses different shapes and areas for the top and bottom surfaces 62, 64. In addition, the total area of the bottom surfaces 64 is less than the area of the top surface 62, so the capacitance value of the capacitor 60 and the total area of the bottom surfaces 64 are linearly directly proportional. If the capacitance value of the capacitor 60 is reduced because of impedance matching, it is done by reducing each area of the bottom surfaces 64 of the capacitor 60 at the same time (making the total area of the bottom surfaces reduced). Furthermore, there is no need to change the area of the top surface 62. The area of the top surface 62 is not changed to keep a wide, stable, and non-burning electrically connected path so that the bias voltage circuit 52 is capable of providing high power bias voltage power to each amplification unit 56. While keeping the bias voltage circuit 52 electrically connected to the amplification units 56, the capacitance value of the capacitor 60 is capable of changing by adjusting each area of the bottom surfaces. This allows the adjustable range of the capacitance value of the capacitor 60 to be bigger, and the flexibility of impedance matching to be increased.

Figure 5:
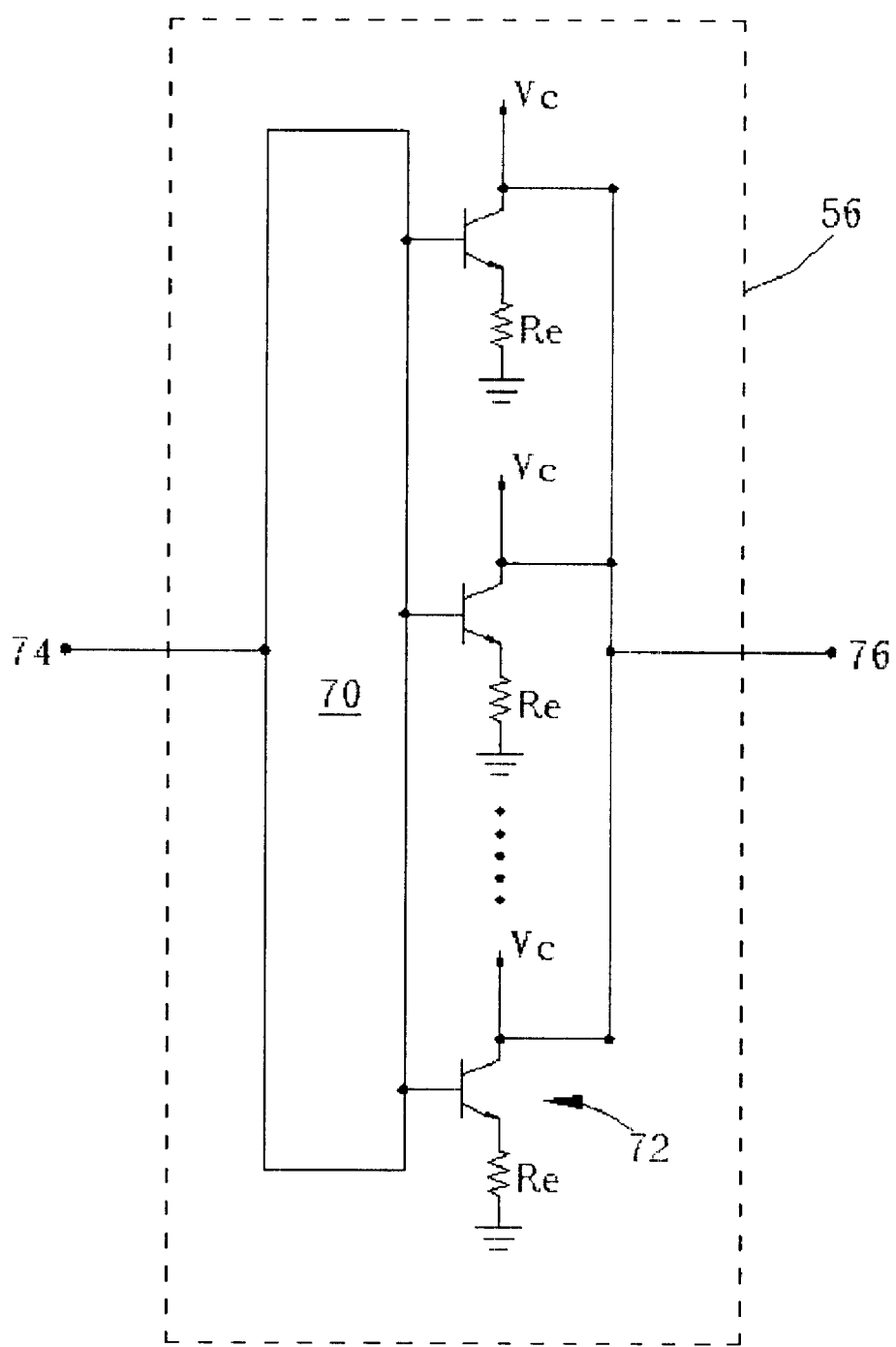
FIG. 5 is a diagram of a structure of present invention amplification units in the signal amplification circuit.

Please refer to FIG. 5. FIG. 5 is a diagram of an internal structure of the amplification units 56 in the present invention signal amplification circuit 40. An end 74 of the amplification units 56 in FIG. 5 is electrically connected to the top surface 62 of the capacitor 60 (see FIG. 4), and an other end 76 is electrically connected to the output circuit 58 (see FIG. 4). The amplification units 56 have an impedance matching circuit 70 and a plurality of gallium arsenide bipolar junction transistors 72. Bases of each bipolar junction transistor 72 are electrically connected to the impedance matching circuit 70. Collectors are electrically connected to the output ports 76 and direct current bias voltage Vc. Emitters are connected to an emitter resistor, with the resistors connected to ground. The impedance matching circuit 70 provides the amplification units 56 impedance matching the primary resistiveness impedance. Emitter resistors Re provide bipolar junction transistors 72 with current overload protection and negative feedback.

In short, the present invention uses a capacitor 60 whose areas of the top and bottom surfaces 62, 64 are not equal to provide an electrically connecting path of impedance matching and bias voltage power. The capacitor 60 in the present invention is not only capable of a flexible design, but also of keeping the electrically connected path of the bias voltage power freely flowing and stable, preventing burns because of high power bias voltage power passing.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A signal amplification circuit used in a portable communications device, the signal amplification circuit comprising:

an input circuit for supplying input signals;

an output circuit for outputting amplified signals;

a capacitor comprising a top surface and a plurality of bottom surfaces, a total area of the bottom surfaces being less than a total area of the top surface, the bottom surfaces respectively electrically connected to the input circuit;

a plurality of amplification units electrically connected between the top surface and the output circuit; and a bias voltage circuit electrically connected to the top surface for supplying a direct current bias voltage to the amplification units;

wherein when an input signal passes into the bottom surfaces of the capacitor through the input circuit, the input signal is coupled with the top surface of the capacitor and passes to the output circuit through the plurality of amplification units to generate an amplified output signal.

2. The signal amplification circuit of claim 1 further comprising a pre-amplification circuit electrically connected between the input circuit and the bottom surfaces of the capacitor, the pre-amplification circuit comprising a first signal input port and a plurality of first signal output ports corresponding to the bottom surfaces, the first signal input port being electrically connected to the input circuit, and each of the first signal output ports being electrically connected to a respective bottom surface.

3. The signal amplification circuit of claim 1 wherein the number of the amplification units is equal to the number of the bottom surfaces.

4. The signal amplification circuit of claim 1 wherein the amplification units are gallium arsenide (GaAs) power amplification circuits.

5. The signal amplification circuit of claim 1 wherein each amplification unit comprises a plurality of bipolar junction transistors.

6. The signal amplification circuit of claim 1 wherein each amplification unit comprises:

an impedance matching circuit for adjusting an input impedance of the amplification unit; and a plurality of bipolar junction transistors, bases of the bipolar junction transistors being electrically connected to the impedance matching circuit, and collectors of the bipolar junction transistors being electrically connected to the output circuit.

7. The signal amplification circuit of claim 6 wherein each amplification unit further comprises emitter resistors corresponding to the bipolar junction transistors, one end of each emitter resistor being electrically connected to a corresponding emitter of one of the bipolar junction transistors, the other end of the emitter resistor being electrically connected to ground.

* * * * *